US012653041B2

(12) United States Patent
Yanagimoto et al.

(10) Patent No.: US 12,653,041 B2
(45) Date of Patent: Jun. 9, 2026

(54) POWER SEMICONDUCTOR APPARATUS AND POWER CONVERSION APPARATUS

(71) Applicant: Mitsubishi Electric Corporation, Tokyo (JP)

(72) Inventors: Tatsunori Yanagimoto, Tokyo (JP); Tsuyoshi Uraji, Tokyo (JP); Yasuhiro Sakai, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 413 days.

(21) Appl. No.: 18/559,443

(22) PCT Filed: May 18, 2022

(86) PCT No.: PCT/JP2022/020678
§ 371 (c)(1),
(2) Date: Nov. 7, 2023

(87) PCT Pub. No.: WO2022/249951
PCT Pub. Date: Dec. 1, 2022

(65) Prior Publication Data
US 2024/0243041 A1 Jul. 18, 2024

(30) Foreign Application Priority Data

May 26, 2021 (JP) ................................. 2021-088340

(51) Int. Cl.
*H10W 70/40* (2026.01)
*H10W 72/00* (2026.01)
*H10W 90/00* (2026.01)
(52) U.S. Cl.
CPC ........ *H10W 70/429* (2026.01); *H10W 72/884* (2026.01); *H10W 90/734* (2026.01); *H10W 90/753* (2026.01); *H10W 90/754* (2026.01)

(58) Field of Classification Search
CPC . H10W 70/429; H10W 70/60; H10W 72/884; H10W 72/5445; H10W 72/5475;
(Continued)

(56) References Cited

U.S. PATENT DOCUMENTS

2011/0186999 A1    8/2011  Momose et al.
2017/0317008 A1 * 11/2017  Momose ............. H10W 40/255
(Continued)

FOREIGN PATENT DOCUMENTS

JP        2011159780 A      8/2011
JP        2012152792 A      8/2012
(Continued)

OTHER PUBLICATIONS

PCT/JP2022/020678—PCT Written Opinion of the International Searching Authority. (Year: 2022).*
(Continued)

*Primary Examiner* — Calvin Y Choi
(74) *Attorney, Agent, or Firm* — BUCHANAN, INGERSOLL & ROONEY PC

(57) ABSTRACT

A power semiconductor apparatus includes an insulating substrate, a power semiconductor device, and an electrode terminal. The insulating substrate includes a conductive circuit pattern. The electrode terminal is ultrasonically bonded to the conductive circuit pattern. The electrode terminal includes a strip conductor and a conductive film. The conductive film is solid-phase diffusion bonded to the conductive circuit pattern. A first Vickers hardness of the conductive film is higher than a second Vickers hardness of the conductive circuit pattern.

13 Claims, 8 Drawing Sheets

(58) Field of Classification Search
CPC . H10W 72/926; H10W 72/00; H10W 72/076;
H10W 90/734; H10W 90/753; H10W
90/754; H10W 90/00; H10W 90/701;
H10W 40/255; H10W 40/10; H10W
42/80; H10W 74/127; H10W 76/47;
H10W 76/13
See application file for complete search history.

(56) References Cited

U.S. PATENT DOCUMENTS

| | | | |
|---|---|---|---|
| 2018/0053737 A1* | 2/2018 | Ogawa ................. | H10W 40/10 |
| 2018/0151533 A1 | 5/2018 | Yoneda et al. | |

FOREIGN PATENT DOCUMENTS

| | | |
|---|---|---|
| JP | 2016139635 A | 8/2016 |
| JP | 2017152506 A | 8/2017 |
| JP | 2017199813 A | 11/2017 |
| WO | 2016199621 A1 | 12/2016 |

OTHER PUBLICATIONS

International Search Report (PCT/ISA/210) with translation and
Written Opinion (PCT/ISA/237) mailed on Jul. 19, 2022, by the
Japan Patent Office as the International Searching Authority for
International Application No. PCT/JP2022/020678. (8 pages).

\* cited by examiner

POWER SEMICONDUCTOR APPARATUS AND POWER CONVERSION APPARATUS

TECHNICAL FIELD

The present disclosure relates to a power semiconductor apparatus and a power conversion apparatus.

BACKGROUND ART

Japanese Patent Laying-Open No. 2017-199813 (PTL 1) discloses a semiconductor apparatus including a heat dissipating base, an insulating circuit board, an electrode terminal, and a power semiconductor device. The insulating circuit board includes an insulating substrate, a first conductor layer provided on a lower surface of the insulating substrate, and a second conductor layer provided on an upper surface of the insulating substrate. The first conductor layer is bonded to the heat dissipating base with a bonding member. The power semiconductor device is mounted on the insulating circuit board. The electrode terminal is ultrasonically bonded to the second conductor layer through an ultrasonic horn. The crystal grain size in each of the second conductor layer and the electrode terminal at the bonding interface between the second conductor layer and the electrode terminal is 1 μm or more.

CITATION LIST

Patent Literature

PTL 1: Japanese Patent Laying-Open No. 2017-199813

SUMMARY OF INVENTION

Technical Problem

In the semiconductor apparatus disclosed in PTL 1, however, when the electrode terminal is ultrasonically bonded to the second conductor layer, a large amount of metal powder is produced at the interface between the electrode terminal and the second conductor layer. The metal powder may adhere to members such as the second conductor layer inside the semiconductor apparatus to cause a dielectric breakdown of the semiconductor apparatus during the operation of the semiconductor apparatus. The present disclosure has been made in view of the above-described problems, and an object of the present disclosure is to provide a power semiconductor apparatus and a power conversion apparatus that are improved in reliability.

Solution to Problem

A power semiconductor apparatus of the present disclosure includes an insulating substrate, a power semiconductor device, and an electrode terminal. The insulating substrate includes an insulating layer and a conductive circuit pattern provided on the insulating layer. The power semiconductor device is bonded to the conductive circuit pattern. The electrode terminal is ultrasonically bonded to the conductive circuit pattern. The electrode terminal includes: a strip conductor including an end portion; and a conductive film. The end portion of the strip conductor has a first surface that faces the conductive circuit pattern. The conductive film covers the first surface and is solid-phase diffusion bonded to the conductive circuit pattern. The end portion of the strip conductor and the conductive circuit pattern are separated by the conductive film from each other. A first Vickers hardness of the conductive film is higher than a second Vickers hardness of the conductive circuit pattern.

A power conversion apparatus of the present disclosure includes: a main conversion circuit including the power semiconductor apparatus of the present disclosure, the main conversion circuit serving to receive electric power, convert the electric power, and output the electric power; and a control circuit that outputs a control signal for controlling the main conversion circuit to the main conversion circuit.

Advantageous Effects of Invention

Metal powder produced during ultrasonic bonding of the electrode terminal to the conductive circuit pattern is reduced. This reduces the possibility of occurrence of a dielectric breakdown in the power semiconductor apparatus. The power semiconductor apparatus and the power conversion apparatus of the present disclosure are improved in reliability.

DESCRIPTION OF EMBODIMENTS

Figure 1:
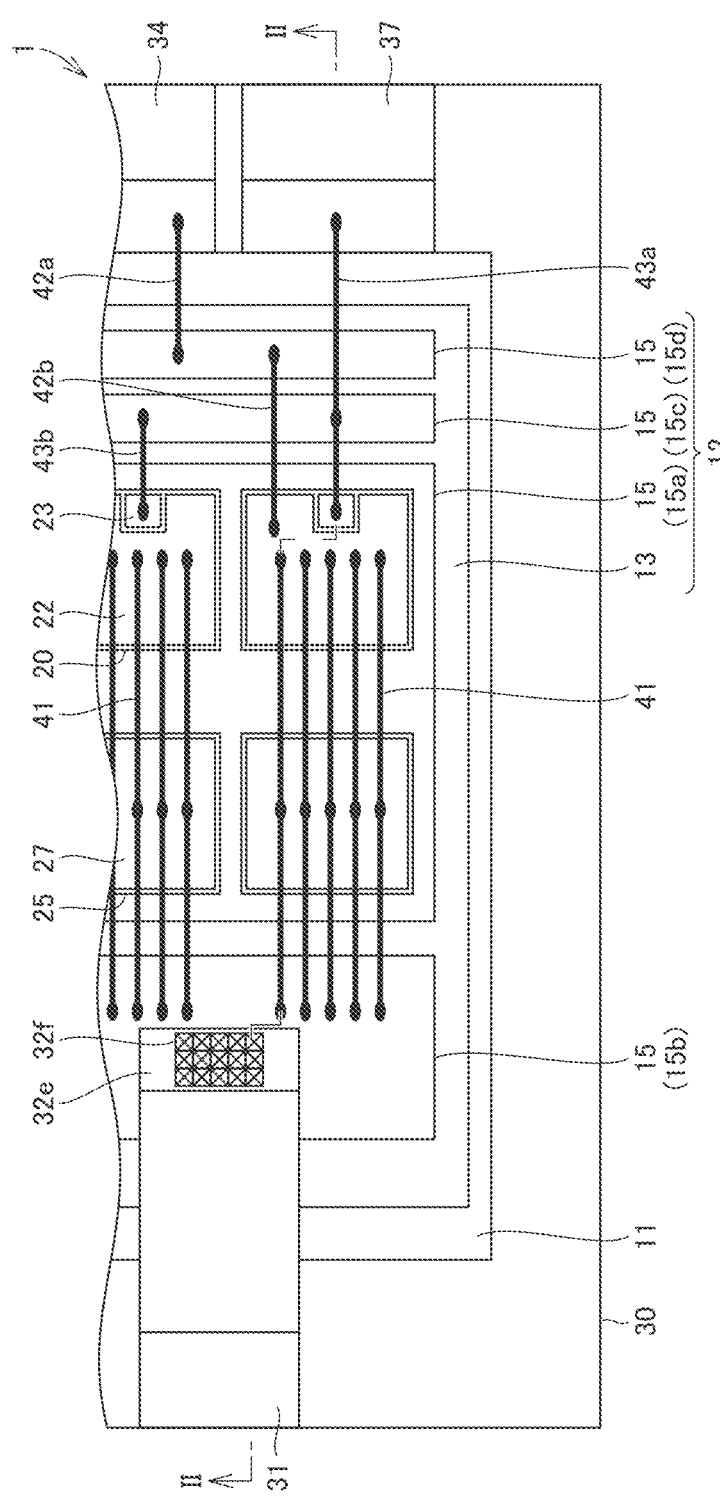
FIG. 1 is a schematic partial enlarged plan view of a power semiconductor module of a first embodiment.
Figure 2:
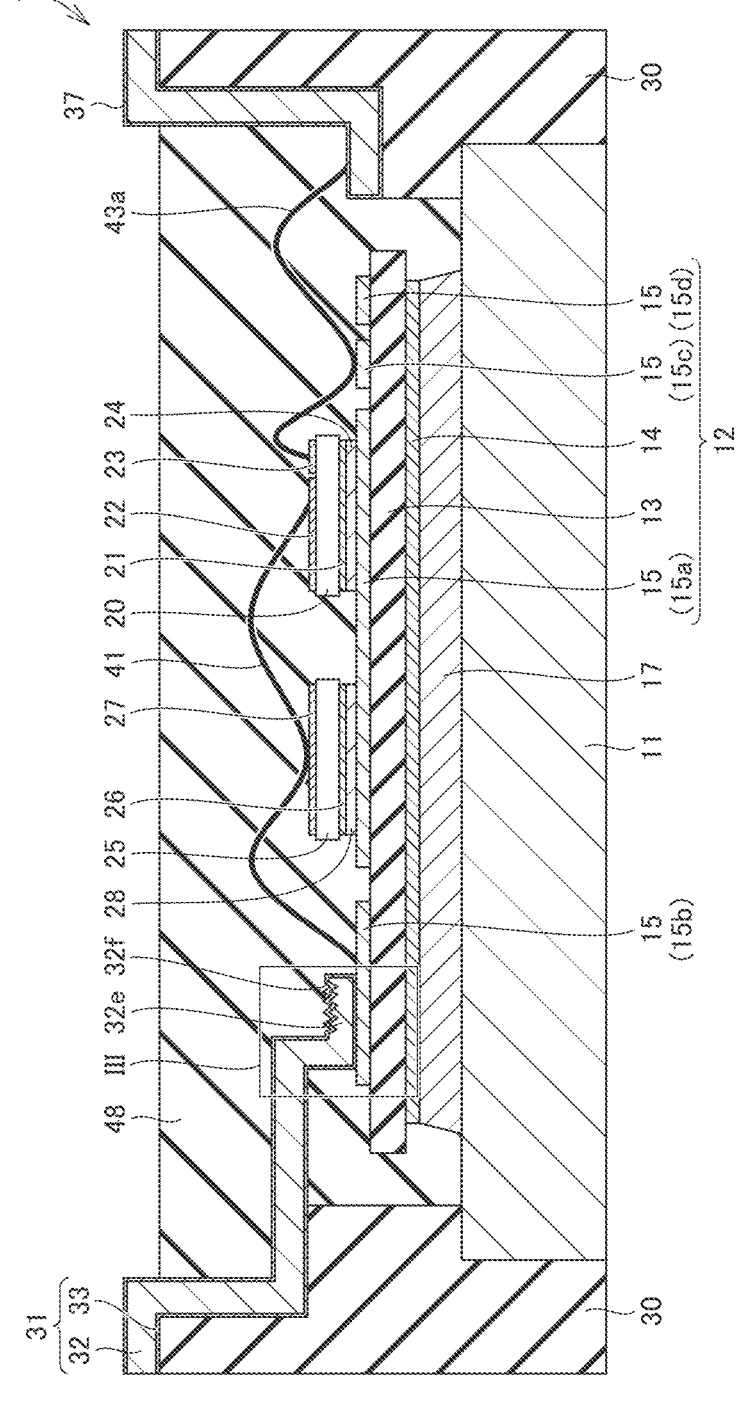
FIG. 2 is a schematic cross-sectional view showing the power semiconductor module of the first embodiment and taken along a cross-sectional line II-II shown in FIG. 1.
Figure 3:
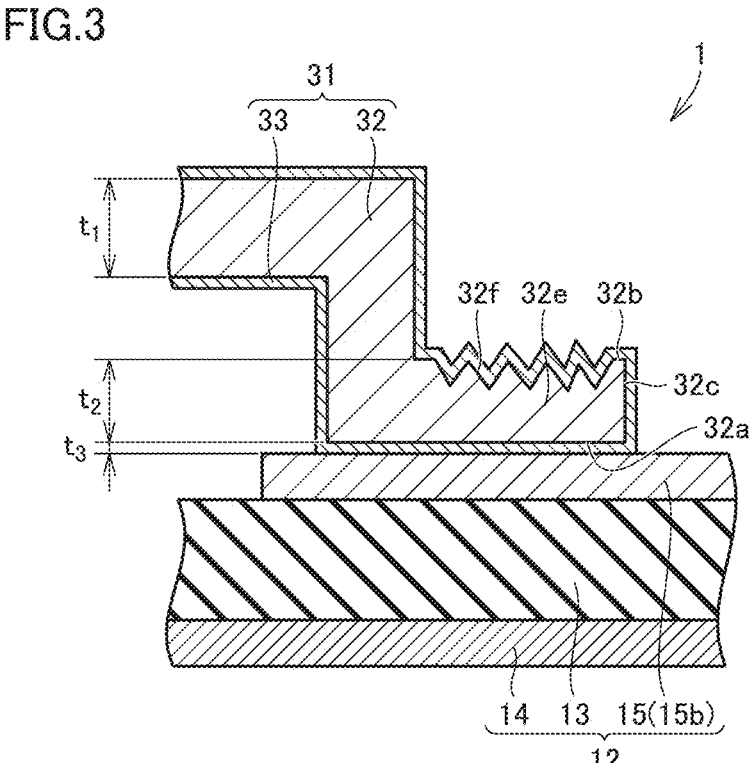
FIG. 3 is a schematic partial enlarged cross-sectional view of a region III shown in FIG. 2 and included in the power semiconductor module of the first embodiment.

The following describes embodiments of the present disclosure. The same configurations are denoted by the same reference characters, and the description thereof will not be repeated.

First Embodiment

Referring to FIGS. 1 to 5, a power semiconductor apparatus 1 of the first embodiment will be hereinafter described. Power semiconductor apparatus 1 mainly includes an insulating substrate 12, power semiconductor devices (20, 25), electrode terminals 31, 34, and 37, and conductive wires 41, 42a, 42b, 43a, and 43b. Power semiconductor apparatus 1 may further include a base plate 11, a case 30, and a sealing member 48.

Base plate 11 is formed, for example, of metal such as Cu, an alloy such as CuMo, or a metal-based composite material such as AlSiC. Base plate 11 is fixed to case 30. Base plate 11 supports insulating substrate 12. Base plate 11 is a heat sink that dissipates heat generated in the power semiconductor devices (20, 25) to the outside of power semiconductor apparatus 1.

Insulating substrate 12 includes an insulating layer 13 and a conductive circuit pattern 15. Insulating substrate 12 may further include a conductor layer 14.

Insulating layer 13 may be formed of ceramic such as aluminum nitride (AlN), aluminum oxide ($Al_2O_3$), or silicon nitride ($Si_3N_4$). Insulating layer 13 may be formed of an organic insulating material in which a filler such as silica, alumina, or boron nitride (BN) is dispersed in a binder resin such as an epoxy resin or a liquid crystal polymer. The thickness of insulating layer 13 is, for example, 0.3 mm or more and 1.0 mm or less.

Conductive circuit pattern 15 is provided on the first main surface of insulating layer 13. Conductive circuit pattern 15 is brazed to insulating layer 13. Conductive circuit pattern 15 is formed of metal such as copper. Conductive circuit pattern 15 is a rolled copper foil, for example. Conductive circuit pattern 15 is lower in Vickers hardness than conductive film 33. Since conductive circuit pattern 15 is heat-treated when conductive circuit pattern 15 is brazed to insulating layer 13, the Vickers hardness of conductive circuit pattern 15 is lower than that of strip conductor 32. The Vickers hardness of conductive circuit pattern 15 is, for example, 40 HV or higher and 50 HV or lower. The thickness of conductive circuit pattern 15 is, for example, 0.25 mm or more and 1.0 mm or less.

Figure 5:
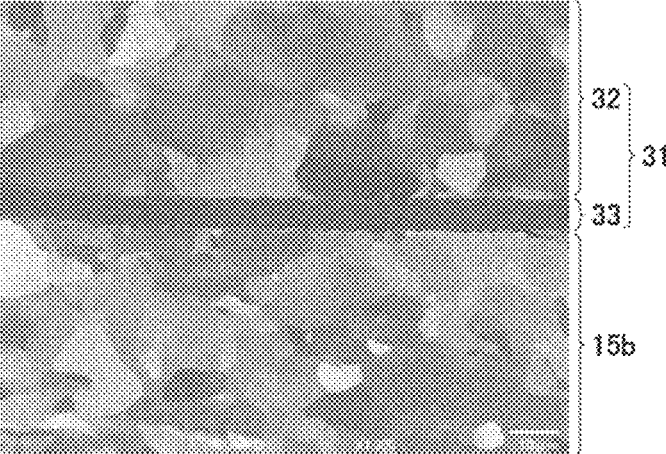
FIG. 5 is a cross-sectional SEM image of a bonding portion between the electrode terminal and a conductive circuit pattern in the power semiconductor module of the first embodiment.

Conductive circuit pattern 15 includes conductor patterns 15a, 15b, 15c, and 15d, for example. Referring to FIG. 5, the crystal grain size in conductive circuit pattern 15 (conductor pattern 15b) at the bonding portion between conductive circuit pattern 15 (conductor pattern 15b) and electrode terminal 31 is larger than 1 μm. In the present specification, the crystal grain size means an average value of diameters of crystal grains measured from a cross-sectional SEM image of the bonding portion between conductive circuit pattern 15 (conductor pattern 15b) and electrode terminal 31.

Conductor layer 14 is provided on the second main surface of insulating layer 13 opposite to the first main surface of insulating layer 13. Conductor layer 14 is made of metal such as copper. Conductor layer 14 is, for example, a rolled copper foil. Conductor layer 14 may be an electrolytic copper foil. The Vickers hardness of the electrolytic copper foil tends to be lower than that of the rolled copper foil. Thus, the effect of power semiconductor apparatus 1 achieved when conductor layer 14 is an electrolytic copper foil is the same as the effect of power semiconductor apparatus 1 achieved when conductor layer 14 is a rolled copper foil. The thickness of conductor layer 14 is, for example, 0.25 mm or more and 1.0 mm or less. The thickness of conductor layer 14 may be the same as or different from the thickness of conductive circuit pattern 15.

Conductor layer 14 can reduce warpage of insulating substrate 12 resulting from a difference between the thermal expansion coefficient of insulating layer 13 and the thermal expansion coefficient of conductive circuit pattern 15. Insulating substrate 12 is fixed to base plate 11. Specifically, conductor layer 14 is bonded to base plate 11 with a conductive bonding member 17 such as solder.

The power semiconductor devices (20, 25) include, for example, a switching element 20 and a freewheeling diode 25. Switching element 20 is, for example, a metal oxide semiconductor field effect transistor (MOSFET) or an insulated gate bipolar transistor (IGBT). Switching element 20 includes, for example, a drain electrode 21, a source electrode 22, and a gate electrode 23. Freewheeling diode 25 is connected in antiparallel to switching element 20. Freewheeling diode 25 is a Schottky barrier diode (SBD) or a free-wheel diode (FWD). Freewheeling diode 25 includes a cathode electrode 26 and an anode electrode 27. The power semiconductor devices (20, 25) each are formed of a semiconductor material such as silicon (Si), silicon carbide (SiC), or gallium nitride (GaN).

The power semiconductor devices (20, 25) are bonded to conductive circuit pattern 15 with conductive bonding members 24, 28. Specifically, switching element 20 (drain electrode 21) is bonded to conductor pattern 15a with conductive bonding member 24. Freewheeling diode 25 (cathode electrode 26) is bonded to conductor pattern 15a with conductive bonding member 28. Conductive bonding members 24 and 28 may be solder such as lead-free solder, or may be metal fine-particle sintered materials such as silver nanoparticle sintered materials.

Electrode terminals 31, 34, and 37 are fixed to case 30. Electrode terminal 31 includes a strip conductor 32 and a conductive film 33.

Strip conductor 32 is formed, for example, of oxygen-free copper (for example, C1020-1/2H, C1020-1/4H, or C1020-H) or tough pitch copper. Strip conductor 32 has a thickness $t_1$, for example, of 0.8 mm or more and 2.5 mm or less. The Vickers hardness of strip conductor 32 is, for example, 100 HV or more and 130 HV or less. Strip conductor 32 includes an end portion 32e. Strip conductor 32 is bent at end portion 32e. End portion 32e includes: a first surface 32a facing conductive circuit pattern 15 (conductor pattern 15b): a second surface 32b opposite to first surface 32a; and an end surface 32c connecting first surface 32a and second surface 32b.

Conductive film 33 covers first surface 32a, second surface 32b, and end surface 32c. Conductive film 33 may cover the entire surface of strip conductor 32. Conductive film 33 is, for example, a nickel plated film. Conductive film 33 has a thickness $t_3$ smaller than thickness $t_1$ of strip conductor 32. Thickness $t_3$ of conductive film 33 is, for example, 2 μm or more and 15 μm or less. The Vickers hardness of conductive film 33 is higher than that of strip conductor 32. The Vickers hardness of conductive film 33 is, for example, 200 HV or higher and 350 HV or lower.

The configuration of each of electrode terminals 34 and 37 is the same as the above-described configuration of electrode terminal 31. Electrode terminal 31 is ultrasonically bonded to conductive circuit pattern 15 (specifically, conductive pattern 15b). End portion 32e of strip conductor 32 is bonded to conductive circuit pattern 15. Conductive film 33 is located between end portion 32e of strip conductor 32 (or first surface 32a of strip conductor 32) and conductive circuit pattern 15. End portion 32e of strip conductor 32 (or first surface 32a of strip conductor 32) is separated by conductive film 33 from conductive circuit pattern 15.

Conductive film 33 is solid-phase diffusion bonded to conductive circuit pattern 15. For example, Ni and Cu may form all proportional solid solution alloy. Thus, when conductive film 33 is made of Ni and conductive circuit pattern 15 is made of Cu, conductive film 33 can be solid-phase diffusion bonded to conductive circuit pattern 15. Referring to FIG. 5, the crystal grain size in strip conductor 32 at the bonding portion between conductive circuit pattern 15 and electrode terminal 31 is larger than 1 μm.

Second surface 32b of strip conductor 32 is provided with an uneven structure 32f having protrusions and recesses. Uneven structure 32f is provided as pressure marks of an ultrasonic horn 50 (see FIG. 4). Specifically, second surface 32b is provided with uneven structure 32f complementary to the shape of a knurled portion 53 formed at the tip end of ultrasonic horn 50. Conductive film 33 covers uneven structure 32f. Conductive film 33 is also provided with an uneven structure similar to uneven structure 32f.

A thickness $t_2$ of end portion 32e of strip conductor 32 of electrode terminal 31 may be smaller than thickness $t_1$ of strip conductor 32 (excluding end portion 32e) of electrode terminal 31. Thus, the stress acting on the bonding portion between conductive circuit pattern 15 and electrode terminal 31 during the operation of power semiconductor apparatus 1 may be reduced. This stress includes: a first stress caused by the difference between the thermal expansion coefficient of electrode terminal 31 and the thermal expansion coefficient of insulating layer 13: and a second stress caused by expansion or contraction of case 30. The first stress acts in a direction along the bonding interface between conductive circuit pattern 15 (conductor pattern 15b) and electrode terminal 31 (conductive film 33). The second stress acts in a direction perpendicular to the bonding interface between conductive circuit pattern 15 (conductor pattern 15b) and electrode terminal 31 (conductive film 33).

Conductive wires 41, 42a, 42b, 43a, and 43b each are, for example, a metal wire such as an Al wire, an Au wire, or a Cu wire. A current flows more through conductive wire 41 than through conductive wires 42a, 42b, 43a, and 43b. Thus, each conductive wire 41 is larger in diameter than each of conductive wires 42a, 42b, 43a, and 43b. The diameter of each conductive wire 41 is, for example, larger than 200 μm and equal to or smaller than 600 μm. The diameter of each of conductive wires 42a, 42b, 43a, and 43b is, for example, equal to or larger than 50 μm and equal to or smaller than 200 μm. Electrode terminals 31, 34, and 37 are electrically connected to the power semiconductor devices (20, 25) through conductive wires 41, 42a, 42b, 43a, and 43b and conductive circuit pattern 15.

Specifically, conductive wire 41 is bonded to conductor pattern 15a, anode electrode 27 of freewheeling diode 25, and source electrode 22 of switching element 20. Thus, electrode terminal 31 is electrically connected to the power semiconductor devices (20, 25) and freewheeling diode 25 through conductive wire 41. Electrode terminal 31 is a main electrode terminal through which a main current flows between source electrode 22 and drain electrode 21. A main current flows through conductive wire 41.

Conductive wire 42a is bonded to electrode terminal 34 and conductor pattern 15d. Conductive wire 42b is bonded to conductor pattern 15d and source electrode 22 of switching element 20. Thus, electrode terminal 34 is electrically connected to switching element 20 through conductive wires 42a and 42b. Electrode terminal 34 is a source controlling electrode terminal.

Conductive wire 43a is bonded to electrode terminal 37, conductor pattern 15c, and gate electrode 23 of switching element 20. Conductive wire 43b is bonded to conductor pattern 15c and gate electrode 23 of switching element 20. Thus, electrode terminal 37 is electrically connected to switching element 20 through conductive wires 43a and 43b. Electrode terminal 37 is a gate controlling electrode terminal.

Case 30 is made of an insulating resin such as a polyphenyl sulfide resin (PPS), a poly butylene terephthalate resin (PBT), or a polyethylene terephthalate resin (PET). Insulating substrate 12 and the power semiconductor devices (20, 25) are surrounded by case 30. Case 30 is fixed to base plate 11 with an adhesive agent (not shown).

Sealing member 48 seals the power semiconductor devices (20, 25), insulating substrate 12, parts of electrode terminals 31, 34, and 37 including end portions 32e of electrode terminals 31, 34, 37, and conductive wires 41, 42a, 42b, 43a, and 43b. Sealing member 48 is made of an insulating resin such as an epoxy resin or silicone gel. A filler may be dispersed in the insulating resin of sealing member 48.

The following describes steps of obtaining electrode terminal 31 in a method of manufacturing power semiconductor apparatus 1 of the present embodiment. A metal plate such as a Cu plate is cut to obtain strip conductor 32. Strip conductor 32 is immersed in a plating solution. A current is applied to flow between anode electrode 27 and a cathode electrode that is strip conductor 32. Then, conductive film 33 is formed on the surface of strip conductor 32. In the case of conductive film 33 formed of a nickel film, for example, a Watts bath, a Wood's bath, or a sulfamic acid bath can be used as a plating solution. The Watts bath contains nickel sulfate, nickel hydrochloride, and boric acid as main components. The Wood's bath contains nickel chloride and hydrochloric acid as main components. The sulfamic acid bath contains nickel chloride, nickel sulfamic acid, and boric acid as main components.

Figure 4:
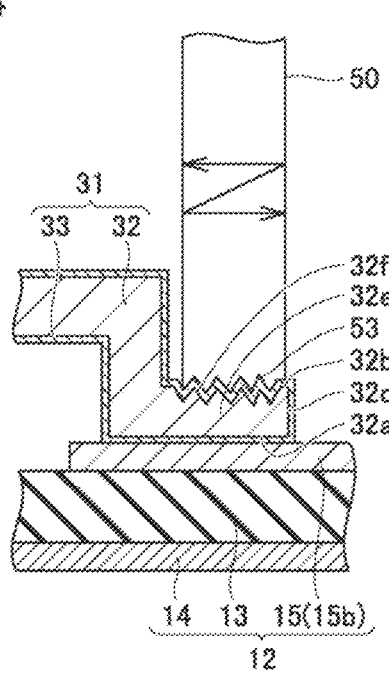
FIG. 4 is a schematic cross-sectional view showing a step of bonding an electrode terminal in the power semiconductor module of the first embodiment.

Referring to FIG. 4, the following describes steps of ultrasonically bonding electrode terminal 31 to conductive circuit pattern 15 (conductor pattern 15b) in the method of manufacturing power semiconductor apparatus 1 of the present embodiment.

Electrode terminal 31 is placed on conductive circuit pattern 15 (conductor pattern 15b). Ultrasonic horn 50 is pressed against electrode terminal 31. To the interface between conductive circuit pattern 15 (conductor pattern 15b) and electrode terminal 31 (conductive film 33), ultrasonic horn 50 applies ultrasonic vibrations along the interface and pressure in the direction perpendicular to the interface. Conductive film 33 is solid-phase diffusion bonded to conductive circuit pattern 15. Conductive film 33 is located between end portion 32e of strip conductor 32 (or first surface 32a of strip conductor 32) and conductive circuit pattern 15 (conductor pattern 15b). End portion 32e of strip conductor 32 (or first surface 32a of strip conductor 32) is separated by conductive film 33 from conductive circuit pattern 15. In this way, electrode terminal 31 is ultrasonically bonded to conductive circuit pattern 15.

The Vickers hardness of conductive circuit pattern 15 (conductor pattern 15b) is lower than that of conductive film 33. Thus, among conductive circuit pattern 15 and conductive film 33, conductive circuit pattern 15 is mainly deformed when electrode terminal 31 is ultrasonically bonded to conductive circuit pattern 15. The deformation of conductive circuit pattern 15 reduces the impact that is applied to conductive film 33 when electrode terminal 31 is ultrasonically bonded to conductive circuit pattern 15. Thus, conductive film 33 can be prevented from being broken by the pressure applied by ultrasonic horn 50. When electrode terminal 31 is ultrasonically bonded to conductive circuit pattern 15, conductive film 33 prevents direct contact between conductive circuit pattern 15 and strip conductor 32. This reduces the amount of metal powder produced at the bonding interface between conductive circuit pattern 15 and electrode terminal 31. Conductive film 33 is excellently solid-phase diffusion bonded to conductive circuit pattern 15.

Referring to FIG. 5, the crystal grain size in conductive circuit pattern 15 at the bonding portion between conductive circuit pattern 15 and electrode terminal 31 is larger than 1 μm. The crystal grain size in strip conductor 32 at the bonding portion between conductive circuit pattern 15 and electrode terminal 31 is larger than 1 μm. This is because, when electrode terminal 31 is ultrasonically bonded to conductive circuit pattern 15, conductive film 33 prevents direct contact between conductive circuit pattern 15 and strip conductor 32, to thereby prevent the crystal grains in conductive circuit pattern 15 and strip conductor 32 from becoming finer. This results in reduced amount of metal powder produced when the crystal grains in conductive circuit pattern 15 and strip conductor 32 are fined. Also, the amount of metal powder adhering to the members inside power semiconductor apparatus 1 is reduced. Thus, any dielectric breakdown of power semiconductor apparatus 1 can be prevented. Power semiconductor apparatus 1 is improved in reliability.

On the other hand, in the power semiconductor apparatus of the comparative example, electrode terminal 31 does not include conductive film 33, and thus, conductive circuit pattern 15 and strip conductor 32 are in direct contact with each other. Further, both conductive circuit pattern 15 and strip conductor 32 are made of the same material (for example, Cu). Thus, the crystal grains in conductive circuit pattern 15 and strip conductor 32 are fined by the ultrasonic vibrations and the pressure applied to the bonding interface between conductive circuit pattern 15 and electrode terminal 31 (strip conductor 32) when electrode terminal 31 is ultrasonically bonded to conductive circuit pattern 15. The crystal grain size in conductive circuit pattern 15 at the bonding portion between conductive circuit pattern 15 and strip conductor 32 is 1 μm or less, and the crystal grain size in strip conductor 32 at the bonding portion between conductive circuit pattern 15 and electrode terminal 31 is also 1 μm or less. When the crystal grains in conductive circuit pattern 15 and strip conductor 32 are fined, a large amount of metal powder is produced. Such a large amount of metal powder adheres to the members inside the power semiconductor apparatus of the comparative example to thereby cause a dielectric breakdown of the power semiconductor apparatus of the comparative example. The power semiconductor apparatus of the comparative example is reduced in reliability.

Table 1 shows the number of particles of metal powder produced when electrode terminal 31 is ultrasonically bonded to conductive circuit pattern 15 in an example, which is one example of power semiconductor apparatus 1 of the present embodiment, and a comparative example. The number of particles of metal powder was counted in the following manner. A black coloring agent is sprayed onto a portion of conductive circuit pattern 15 excluding an area to which electrode terminal 31 is ultrasonically bonded, so that the portion of conductive circuit pattern 15 is colored black. Then, an optical microscope is used to count the number of particles of metal powder scattered over the black colored portion of conductive circuit pattern 15 by ultrasonically bonding electrode terminal 31 to conductive circuit pattern 15. In the example and the comparative example, the load applied to electrode terminal 31 by ultrasonic horn 50 is 700 N. As shown in Table 1, the number of particles of the metal powder produced in the example is significantly smaller than the number of particles of the metal powder produced in the comparative example.

TABLE 1

| | The Number of Particles of Metal Powder |
|---|---|
| Example | 9 |
| Comparative Example | 39 |

Ultrasonic horn 50 is provided with knurled portion 53. When ultrasonic horn 50 is pressed against electrode terminal 31, knurled portion 53 bites into electrode terminal 31. Among strip conductor 32 and conductive film 33, strip conductor 32 is mainly deformed. On second surface 32b of strip conductor 32, uneven structure 32f is formed as pressure marks of ultrasonic horn 50. An uneven structure similar to uneven structure 32f is also formed in conductive film 33.

When knurled portion 53 bites into electrode terminal 31, metal shavings are produced from electrode terminal 31. Some of the metal shavings adhere to knurled portion 53. In the present embodiment, however, second surface 32b of strip conductor 32 is covered by conductive film 33 higher in Vickers hardness than strip conductor 32. Thus, the amount of metal shavings produced from electrode terminal 31 is reduced. Also, the amount of metal shavings adhering to the members inside power semiconductor apparatus 1 is reduced. Thus, occurrence of a dielectric breakdown in power semiconductor apparatus 1 can be prevented. Power semiconductor apparatus 1 is improved in reliability. In addition, the amount of metal shavings adhering to knurled portion 53 is also reduced. This reduces the frequency in which the metal shavings adhering to knurled portion 53 are removed using a chemical solution such as sulfuric acid. Thus, power semiconductor apparatus 1 is improved in productivity.

When electrode terminal 31 is ultrasonically bonded to conductive circuit pattern 15, conductive film 33 on first surface 32a may be broken to expose a part of first surface 32a from conductive film 33. Even when a part of first surface 32a is exposed from conductive film 33, the amount of metal powder to be produced can still be reduced in the present embodiment.

The following describes the effects of power semiconductor apparatus 1 of the present embodiment.

Power semiconductor apparatus 1 of the present embodiment includes insulating substrate 12, power semiconductor devices (20, 25), and electrode terminal 31. Insulating substrate 12 includes insulating layer 13 and conductive circuit pattern 15 provided on insulating layer 13. The power semiconductor devices (20, 25) are bonded to conductive circuit pattern 15. Electrode terminal 31 is ultrasonically bonded to conductive circuit pattern 15. Electrode terminal 31 includes: strip conductor 32 including end portion 32e: and conductive film 33. End portion 32e of strip conductor 32 includes first surface 32a facing conductive circuit pattern 15. Conductive film 33 covers first surface 32a and is solid-phase diffusion bonded to conductive circuit pattern 15. End portion 32e of strip conductor 32 is separated by conductive film 33 from conductive circuit pattern 15. The first Vickers hardness of conductive film 33 is higher than the second Vickers hardness of conductive circuit pattern 15.

Thus, when electrode terminal 31 is ultrasonically bonded to conductive circuit pattern 15, conductive circuit pattern 15 among conductive circuit pattern 15 and conductive film 33 is mainly deformed without direct contact between conductive circuit pattern 15 and strip conductor 32. This reduces the amount of metal powder produced when electrode terminal 31 is ultrasonically bonded to conductive circuit pattern 15. This reduces the possibility of occurrence of a dielectric breakdown in power semiconductor apparatus 1. Power semiconductor apparatus 1 is improved in reliability. Further, electrode terminal 31 ultrasonically bonded to conductive circuit pattern 15 allows: a larger current to flow through electrode terminal 31; and a longer life to be achieved in the bonding portion between electrode terminal 31 and conductive circuit pattern 15, as compared with the case where electrode terminal 31 is bonded with solder to conductive circuit pattern 15.

In power semiconductor apparatus 1 of the present embodiment, the third Vickers hardness of strip conductor 32 is lower than the first Vickers hardness of conductive film 33 and higher than the second Vickers hardness of conductive circuit pattern 15.

Thus, among conductive circuit pattern 15, strip conductor 32, and conductive film 33, conductive circuit pattern 15 is mainly deformed when electrode terminal 31 is ultrasonically bonded to conductive circuit pattern 15. This reduces the amount of metal powder produced when electrode terminal 31 is ultrasonically bonded to conductive circuit pattern 15. Thus, power semiconductor apparatus 1 is improved in reliability.

In power semiconductor apparatus 1 of the present embodiment, end portion 32e of strip conductor 32 includes second surface 32b opposite to first surface 32a. Second surface 32b is provided with uneven structure 32f. Conductive film 33 further covers uneven structure 32f.

Among strip conductor 32 and conductive film 33, strip conductor 32 is mainly deformed when electrode terminal 31 is ultrasonically bonded to conductive circuit pattern 15. This reduces the amount of metal shavings produced when electrode terminal 31 is ultrasonically bonded to conductive circuit pattern 15 through ultrasonic horn 50. Power semiconductor apparatus 1 is improved in reliability. Power semiconductor apparatus 1 is improved in productivity.

In power semiconductor apparatus 1 of the present embodiment, end portion 32e of strip conductor 32 includes end surface 32c that connects first surface 32a and second surface 32b. Conductive film 33 covers first surface 32a, second surface 32b including uneven structure 32f, and end surface 32c.

Thus, the metal powder and the metal shavings produced during ultrasonically bonding of electrode terminal 31 to conductive circuit pattern 15 are reduced in amount. Power semiconductor apparatus 1 is improved in reliability. Power semiconductor apparatus 1 is improved in productivity.

In power semiconductor apparatus 1 of the present embodiment, the first crystal grain size in conductive circuit pattern 15 at the bonding portion between conductive circuit pattern 15 and electrode terminal 31 is larger than 1 μm. The second crystal grain size in strip conductor 32 at the bonding portion between conductive circuit pattern 15 and electrode terminal 31 is larger than 1 μm.

This reduces the amount of metal powder produced when electrode terminal 31 is ultrasonically bonded to conductive circuit pattern 15. Power semiconductor apparatus 1 is improved in reliability.

In power semiconductor apparatus 1 of the present embodiment, conductive film 33 has thickness $t_3$ of 2 μm or more and 15 μm or less.

Conductive film 33 having thickness $t_3$ of 2 μm or more can more reliably prevent direct contact between conductive circuit pattern 15 and strip conductor 32 when electrode terminal 31 is ultrasonically bonded to conductive circuit pattern 15. This allows more reliable reduction in the amount of metal powder produced when electrode terminal 31 is ultrasonically bonded to conductive circuit pattern 15. Power semiconductor apparatus 1 is improved in reliability. Since thickness $t_3$ of conductive film 33 is 15 μm or less, the time required to form conductive film 33 is shortened. Thus, power semiconductor apparatus 1 is improved in productivity.

Second Embodiment

Figure 6:
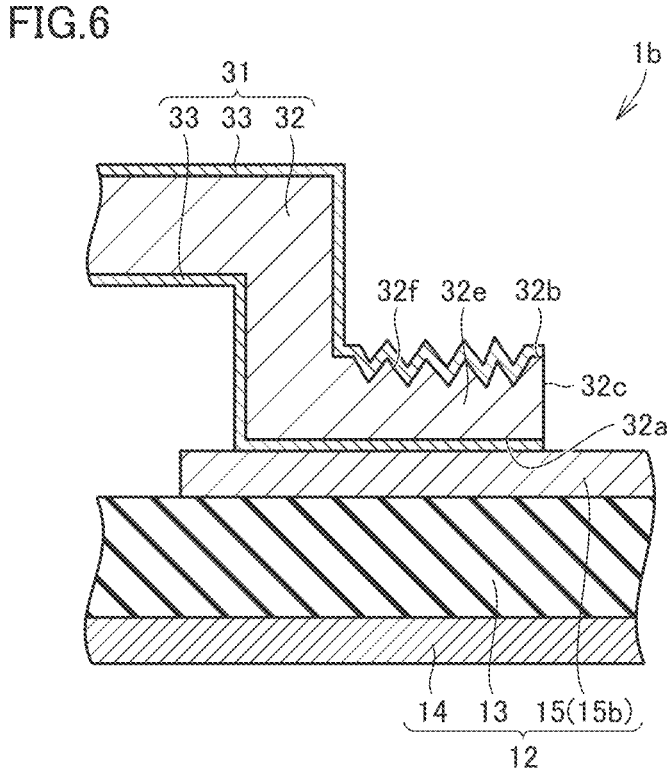
FIG. 6 is a schematic partial enlarged cross-sectional view of a power semiconductor module of a second embodiment.

Referring to FIG. 6, a power semiconductor apparatus 1b of the second embodiment and a manufacturing method thereof will be hereinafter described. Power semiconductor apparatus 1b of the present embodiment has the same configurations and the same effects as those of power semiconductor apparatus 1 of the first embodiment, except for the following points.

In power semiconductor apparatus 1b, end surface 32c of strip conductor 32 is exposed from conductive film 33.

The following describes steps of obtaining electrode terminal 31 in the method of manufacturing power semiconductor apparatus 1b of the present embodiment. A metal plate such as a Cu plate is immersed in a plating solution. A current is applied to flow between an anode electrode and a cathode electrode that is a metal plate. Conductive film 33 is formed on the surface of the metal plate. The metal plate is then cut to thereby obtain strip conductor 32. In this way, in the present embodiment, a metal plate is plated, and thereafter, the plated metal plate is cut to obtain electrode terminal 31. Thus, end surface 32c of strip conductor 32 is exposed from conductive film 33. Since a plurality of electrode terminals 31 can be obtained in one plating, the cost for manufacturing power semiconductor apparatus 1b can be reduced.

Third Embodiment

Figure 7:
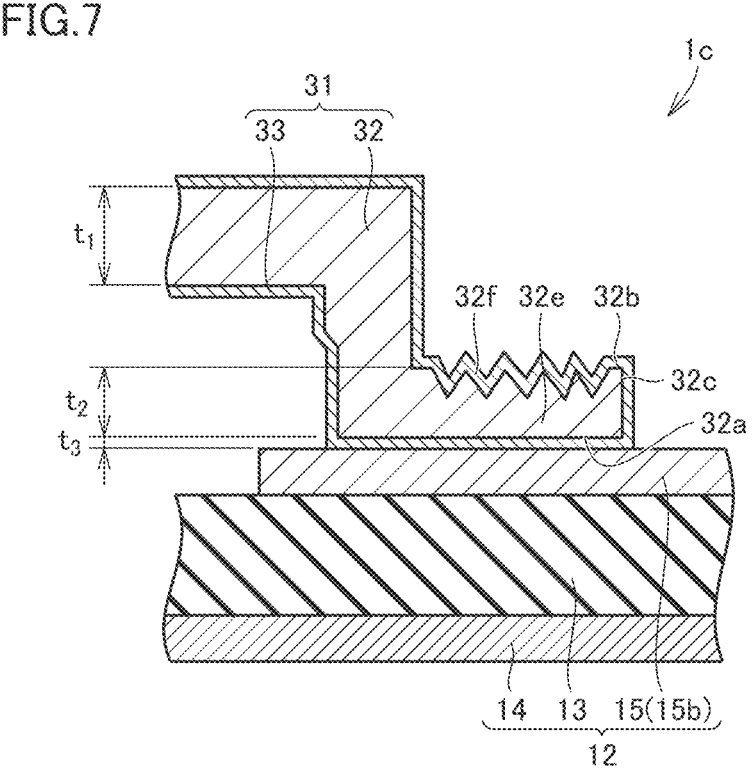
FIG. 7 is a schematic partial enlarged cross-sectional view of a power semiconductor module of a third embodiment.

Referring to FIG. 7, a power semiconductor apparatus 1c of the third embodiment and a manufacturing method thereof will be hereinafter described. Power semiconductor apparatus 1c of the present embodiment has the same configurations and the same effects as those of power semiconductor apparatus 1 of the first embodiment except for the following points. In power semiconductor apparatus 1c, thickness $t_2$ of end portion 32e of strip conductor 32 is smaller than thickness $t_1$ of strip conductor 32 excluding end portion 32e.

Referring to FIGS. 8 to 11, the following describes steps of obtaining electrode terminal 31 in the method of manufacturing power semiconductor apparatus 1c of the present embodiment.

Figure 8:
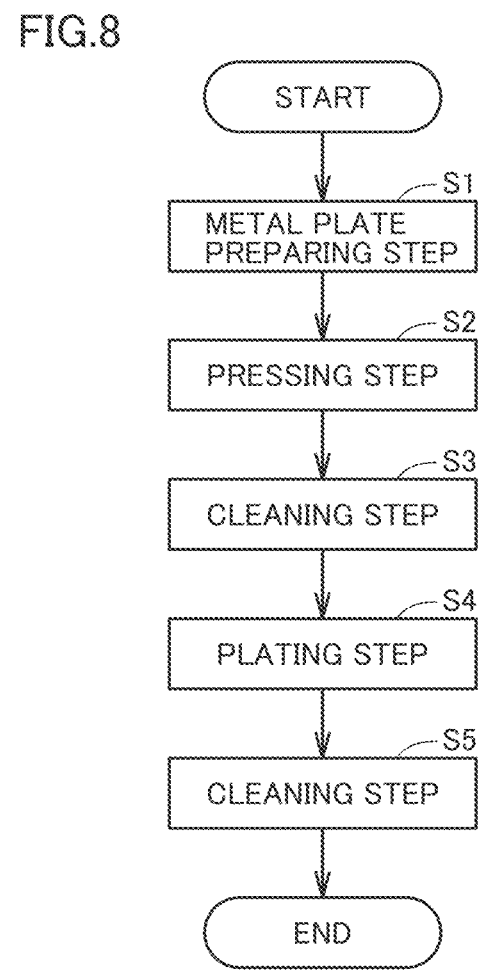
FIG. 8 is a flowchart illustrating a method of manufacturing an electrode terminal included in the power semiconductor module of the third embodiment.
Figure 9:
FIG. 9 is a schematic partial enlarged perspective view showing a step of the method of manufacturing an electrode terminal included in the power semiconductor module of the third embodiment.
Figure 10:
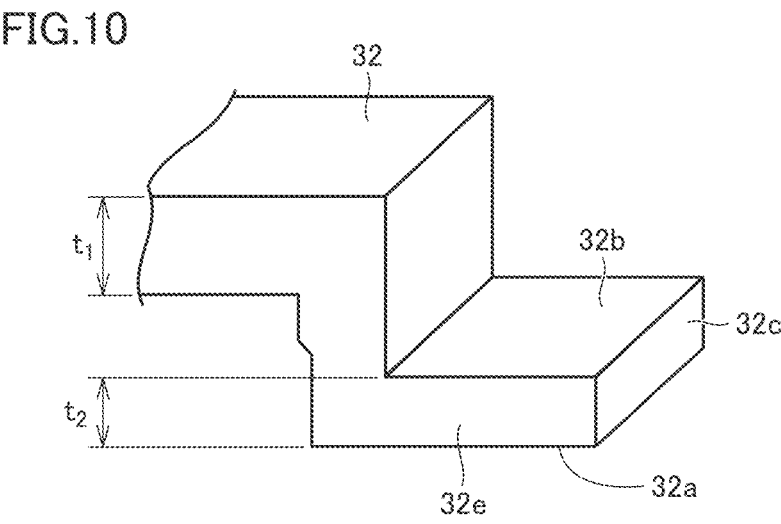
FIG. 10 is a schematic partial enlarged perspective view showing a step subsequent to the step shown in FIG. 9 in the method of manufacturing the electrode terminal included in the power semiconductor module of the third embodiment.
Figure 11:
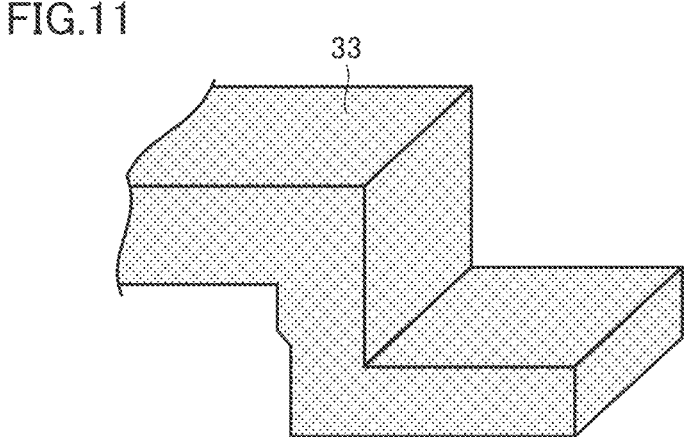
FIG. 11 is a schematic partial enlarged perspective view showing a step subsequent to the step shown in FIG. 10 in the method of manufacturing the electrode terminal included in the power semiconductor module of the third embodiment.

Referring to FIGS. 8 and 9, a metal plate 38 such as a Cu plate is prepared (step S1). Referring to FIGS. 8 and 10, metal plate 38 is pressed to thereby obtain strip conductor 32 from metal plate 38 (step S2). Specifically, while metal plate 38 is cut, metal plate 38 is bent and the end portion of metal plate 38 is thinned by forging. Referring to FIG. 8, strip conductor 32 is cleaned (step S3). Referring to FIGS. 8 and 11, conductive film 33 is formed on the surface of strip conductor 32 (step S4). For example, strip conductor 32 is immersed in a plating solution. A current is applied to flow between anode electrode 27 and the cathode electrode that is strip conductor 32. Conductive film 33 that is a plating film is formed on the surface of strip conductor 32. Referring to FIG. 8, strip conductor 32 covered by conductive film 33 is cleaned (step S5). In this way, electrode terminal 31 of the present embodiment is obtained.

In the present embodiment, metal plate 38 is cut, bent and then thinned to thereby obtain strip conductor 32 in step S2, and thereafter, conductive film 33 is formed in step S4. Thus, conductive film 33 is not broken when metal plate 38 is bent and thinned.

The effects achieved by power semiconductor apparatus 1c of the present embodiment include the following effects in addition to the effects achieved by power semiconductor apparatus 1 of the first embodiment.

In power semiconductor apparatus 1c of the present embodiment, thickness $t_2$ of end portion 32e of strip conductor 32 is smaller than thickness $t_1$ of strip conductor 32 excluding end portion 32e.

Since thickness $t_1$ of strip conductor 32 excluding end portion 32e can be increased, the allowable current of electrode terminal 31 can be increased. Further, since thickness $t_2$ of end portion 32e of strip conductor 32 is reduced, the ultrasonic energy required for ultrasonically bonding electrode terminal 31 to conductive circuit pattern 15 can be reduced. This can reduce the amount of metal powder produced before ultrasonic bonding of electrode terminal 31 to conductive circuit pattern 15 ends.

Fourth Embodiment

In the present embodiment, any one of power semiconductor apparatuses 1, 1b, and 1c of the above-described first to third embodiments is applied to a power conversion apparatus. Although the present disclosure is not limited to a specific power conversion apparatus, the following describes the case of the fourth embodiment in which any one of power semiconductor apparatuses 1, 1b, and 1c of the present disclosure is applied to a three-phase inverter.

Figure 12:
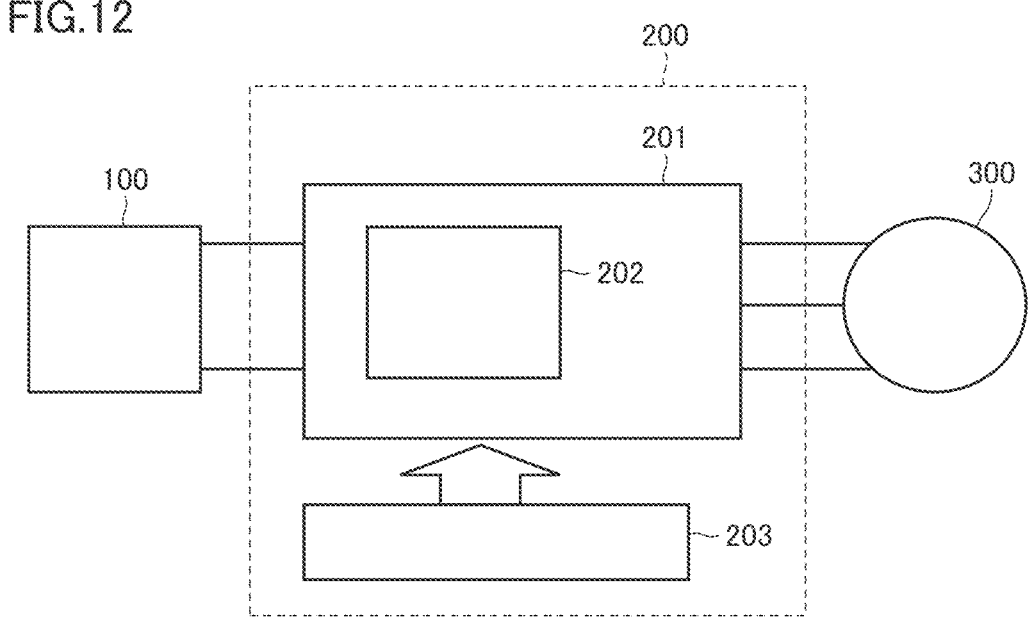
FIG. 12 is a block diagram showing a configuration of a power conversion system of a fourth embodiment.

A power conversion system shown in FIG. 12 is formed of a power supply 100, a power conversion apparatus 200, and a load 300. Power supply 100 is a direct-current (DC) power supply and supplies DC power to power conversion apparatus 200. Power supply 100 is not particularly limited but may be configured, for example, of a DC system, a solar cell, or a storage battery, or may be configured of a rectifier circuit connected to an alternating-current (AC) system or configured of an AC/DC converter. Power supply 100 may be configured of a DC/DC converter that converts DC power output from the DC system into prescribed power.

Power conversion apparatus 200, which is a three-phase inverter connected between power supply 100 and load 300, converts DC power supplied from power supply 100 into AC power, and supplies the converted AC power to load 300. As shown in FIG. 12, power conversion apparatus 200 includes: a main conversion circuit 201 that converts DC power into AC power and outputs the converted AC power; and a control circuit 203 that outputs a control signal for controlling main conversion circuit 201 to main conversion circuit 201.

Load 300 is a three-phase electric motor driven by AC power supplied from power conversion apparatus 200. Load 300 is not limited to a specific application, but is an electric motor mounted on various types of electric devices, and is used as an electric motor, for example, for a hybrid vehicle, an electric vehicle, a railway vehicle, an elevator, or an air conditioner.

Hereinafter, power conversion apparatus 200 will be described in detail. Main conversion circuit 201 includes a switching element (not shown) and a freewheeling diode (not shown). When the switching element switches the voltage supplied from power supply 100, main conversion circuit 201 converts the DC power supplied from power supply 100 into AC power and supplies the converted AC power to load 300. Although main conversion circuit 201 may be formed specifically in various circuit configurations, main conversion circuit 201 of the present embodiment is a three-phase full bridge circuit configured in two levels and may be formed of six switching elements and six freewheeling diodes that are connected in antiparallel to the respective six switching elements. Switching element 20 and freewheeling diode 25 included in any one of power semiconductor apparatuses 1, 1b, and 1c of the above-described first to third embodiments can be applied as each of the switching elements and each of the freewheeling diodes in main conversion circuit 201. Any one of power semiconductor apparatuses 1, 1b, and 1c of the above-described first to third embodiments can be applied as power semiconductor apparatus 202 forming main conversion circuit 201. Six switching elements are configured such that each two switching elements are connected in series to form an upper arm and a lower arm, and each of the pairs of upper and lower arms forms a corresponding phase (a U-phase, a V-phase, and a W-phase) of a full bridge circuit. The output terminals of the upper and lower arms, i.e., three output terminals of main conversion circuit 201, are connected to load 300.

Further, main conversion circuit 201 includes a drive circuit (not shown) for driving each switching element. The drive circuit may be incorporated in power semiconductor apparatus 202 or may be provided outside power semiconductor apparatus 202. The drive circuit generates a drive signal for driving each switching element included in main conversion circuit 201, and supplies the generated drive signal to the control electrode of each switching element in main conversion circuit 201. Specifically, according to the control signal from control circuit 203, the drive circuit outputs a drive signal for turning on each switching element and a drive signal for turning off each switching element to the control electrode of each switching element.

Control circuit 203 controls each switching element in main conversion circuit 201 so as to supply electric power to load 300. Specifically, the time (ON time) at which each switching element in main conversion circuit 201 is to be turned on is calculated based on the electric power to be supplied to load 300. For example, main conversion circuit 201 can be controlled by pulse width modulation (PWM) control for modulating the ON time of each switching element according to the voltage to be output to load 300. Then, a control command (control signal) is output to the drive circuit included in main conversion circuit 201 such that an ON signal is output to the switching element to be set in an ON state at each point of time and such that an OFF signal is output to the switching element to be set in an OFF state at each point of time. According to this control signal, the drive circuit outputs an ON signal or an OFF signal as a drive signal to the control electrode of each switching element.

In power conversion apparatus 200 of the present embodiment, any one of power semiconductor apparatuses 1, 1b, and 1c of the first to third embodiments is applied as power semiconductor apparatus 202 included in main conversion circuit 201. Therefore, power conversion apparatus 200 of the present embodiment is improved in reliability.

The present embodiment has been described with regard to the example in which the present disclosure is applied to a two-level three-phase inverter, but the present disclosure is not limited thereto and is applicable to various types of power conversion apparatuses. In the present embodiment, the power conversion apparatus is configured in two levels, but the power conversion apparatus may be configured in three levels or in a multilevel. When the power conversion apparatus supplies electric power to a single-phase load, the present disclosure may be applied to a single-phase inverter. When the power conversion apparatus supplies electric power to a DC load or the like, the present disclosure may be applied to a DC/DC converter or an AC/DC converter.

The power conversion apparatus to which the present disclosure is applied is not limited to the case where the load is an electric motor, but may also be incorporated, for example, in a power supply device for an electrical discharge machine or a laser beam machine, or in a power supply device for an induction heating cooking machine or a contactless power feeding system. The power conversion apparatus to which the present disclosure is applied may further be used as a power conditioner for a photovoltaic power generation system, a power storage system, or the like.

It should be understood that the first to fourth embodiments disclosed herein are illustrative and non-restrictive in every respect. At least two of the first to fourth embodiments disclosed herein may be combined together as long as there is no inconsistency. The scope of the present disclosure is defined by the terms of the claims, rather than the description above, and is intended to include any modifications within the meaning and scope equivalent to the terms of the claims.

REFERENCE SIGNS LIST

1, 1*b*, 1*c* power semiconductor apparatus, 11 base plate, 12 insulating substrate, 13 insulating layer, 14 conductor layer, 15 conductive circuit pattern, 15*a*, 15*b*, 15*c*, 15*d* conductor pattern, 17 conductive bonding member, 20 switching element, 21 drain electrode, 22 source electrode, 23 gate electrode, 24 conductive bonding member, 25 freewheeling diode, 26 cathode electrode, 27 anode electrode, 28 conductive bonding member, 30 case, 31 electrode terminal, 32 strip conductor, 32*a* first surface, 32*b* second surface, 32*c* end surface, 32*e* end portion, 32*f* uneven structure, 33 conductive film, 34, 37 electrode terminal, 38 metal plate, 41, 42*a*, 42*b*, 43*a*, 43*b* conductive wire, 48 sealing member, 50 ultrasonic horn, 53 knurled portion, 100 power supply, 200 power conversion apparatus, 201 main conversion circuit, 202 power semiconductor apparatus, 203 control circuit, 300 load.

The invention claimed is:

1. A power semiconductor apparatus comprising:
an insulating substrate including an insulating layer and a conductive circuit pattern provided on the insulating layer;
a power semiconductor device bonded to the conductive circuit pattern; and
an electrode terminal ultrasonically bonded to the conductive circuit pattern, wherein
the electrode terminal includes
a strip conductor including an end portion, and
a conductive film, the end portion has a first surface that faces the conductive circuit pattern,
the conductive film covers the first surface and is solid-phase diffusion bonded to the conductive circuit pattern, and
a first Vickers hardness of the conductive film is higher than a second Vickers hardness of the conductive circuit pattern.

2. The power semiconductor apparatus according to claim 1, wherein the end portion and the conductive circuit pattern are separated by the conductive film from each other.

3. The power semiconductor apparatus according to claim 1, wherein a third Vickers hardness of the strip conductor is lower than the first Vickers hardness of the conductive film and higher than the second Vickers hardness of the conductive circuit pattern.

4. The power semiconductor apparatus according to claim 3, wherein
the end portion has a second surface opposite to the first surface,
the second surface is provided with an uneven structure.

5. The power semiconductor apparatus according to claim 4, wherein
the end portion includes an end surface that connects the first surface and the second surface, and
the conductive film covers the first surface, the second surface including the uneven structure, and the end surface.

6. The power semiconductor apparatus according to claim 4, wherein
the end portion includes an end surface that connects the first surface and the second surface,
the conductive film covers the first surface and the second surface including the uneven structure, and
the end surface is exposed from the conductive film.

7. The power semiconductor apparatus according to claim 1, wherein the end portion has a thickness smaller than a thickness of the strip conductor excluding the end portion.

8. The power semiconductor apparatus according to claim 1, wherein
a first crystal grain size in the conductive circuit pattern at a bonding portion between the conductive circuit pattern and the electrode terminal is larger than 1 μm, and
a second crystal grain size in the strip conductor at the bonding portion is larger than 1 μm.

9. The power semiconductor apparatus according to claim 1, wherein the conductive film has a thickness of 2 μm or more and 15 μm or less.

10. The power semiconductor apparatus according to claim 1, wherein
the strip conductor is formed of oxygen-free copper or tough pitch copper, and
the conductive film is a nickel plated film.

11. The power semiconductor apparatus according to claim 1, wherein the conductive circuit pattern is a rolled copper foil.

12. The power semiconductor apparatus according to claim 1, wherein the insulating layer is formed of aluminum nitride or silicon nitride.

13. A power conversion apparatus comprising:
a main conversion circuit including the power semiconductor apparatus according to claim 1, the main conversion circuit serving to receive electric power, convert the electric power, and output the electric power; and a control circuit that outputs a control signal for controlling the main conversion circuit to the main conversion circuit.

\* \* \* \* \*